United States Patent [19]

Himpsel

[11] Patent Number: 5,296,458
[45] Date of Patent: Mar. 22, 1994

[54] EPITAXY OF HIGH $T_c$ SUPERCONDUCTING FILMS ON (001) SILICON SURFACE

[75] Inventor: Franz J. Himpsel, Mt. Kisco, N.Y.

[73] Assignee: International Business Machines Corporation, Armonk, N.Y.

[21] Appl. No.: 893,958

[22] Filed: Jun. 4, 1992

Related U.S. Application Data

[63] Continuation of Ser. No. 632,589, Dec. 21, 1990, abandoned, which is a continuation of Ser. No. 560,242, Jul. 27, 1990, abandoned, which is a continuation of Ser. No. 351,288, May 9, 1989, abandoned, which is a continuation of Ser. No. 151,772, Feb. 3, 1988, abandoned.

[51] Int. Cl.$^5$ .................. B05D 5/12; C30B 23/00; C30B 25/00
[52] U.S. Cl. .................................. 505/1; 505/701; 505/702; 505/730; 505/731; 505/732; 427/62; 427/126.3; 427/419.2; 427/419.3; 156/610; 156/612
[58] Field of Search ............. 505/1, 730, 731, 732, 505/701, 702; 427/62, 63, 419.2, 419.3, 126.3; 156/610, 612

[56] References Cited

U.S. PATENT DOCUMENTS

| | | | |
|---|---|---|---|
| 4,837,609 | 6/1989 | Gurvitch et al. | 357/71 |
| 4,874,741 | 10/1989 | Shaw | 427/62 |
| 4,880,770 | 11/1989 | Mir et al. | 505/1 |

FOREIGN PATENT DOCUMENTS 63-303813 12/1988 Japan .

OTHER PUBLICATIONS

Harper et al., American Vacuum Society, Series 3, pp. 427–431, Nov. 6, 1987.
Bauner, Crystal Growth Properties and Applications, 3, p. 29, 1986.
Narayan et al., "Formation of Thin Superconducting Films by the Laser Process Method", Appl. Phys. Lett., vol. 51(22), Nov. 1987, pp. 1845–1847.
Mogro-Campero et al., "Thin Films of Y-Ba-Cu-O on Silicon and Silicon Dioxide", CRD, General Electric, Jan. 1988, pp. 1–4.
Hammond et al., "Superconducting Thin Films of the Perovskite Superconductors by Electron-beam Deposition", MRS, (Anaheim, Calif.), Apr. 1987, pp. 169–171.
Laibowitz, "Vapor-deposited High $T_c$ Superconducting Oxide Thin Films", AIP No. 165, (Nov. 1987), pp. 2–11.
M. Gurvitch et al., "Preparation and Substrate Reactions of Superconducting Y-Ba-Cu-O Films", Appl. Phys. Lett., 51(13), Sep. 28, 1987, pp. 1027–1029.
C.-A. Chang et al., "Thin-Film YBaCuO Superconductors Formed by Cu/Ba/Y$_2$O$_3$ Layer Structures", Appl. Phys. Lett., 52(1), Jan. 4, 1988, pp. 72–74.
"*High Temperature Superconductors*", by Davison et al., first page, title page, back side of title page and page ix, Materials Research Sym. Proc., vol. 99, 1988, pp. 289–291.
*Thin Film Processing and Characterization of High-Temperature Superconductors*, Harper et al., American Institute of Physics, New York, N.Y., 1988, title page, back side of title page, Preface (2 pages), pp. 12–27 & 432–434.

Primary Examiner—Roy King
Attorney, Agent, or Firm—Jackson E. Stanland; Robert M. Trepp

[57] ABSTRACT

An epitaxial structure comprising a silicon containing substrate and a high $T_c$ copper-oxide-based superconducting layer, which may include an intermediate layer between the silicon substrate and the superconductor layer. Epitaxial deposition is accomplished by depositing a superconductor on a (001) surface of silicon in a manner in which the unit cell of the superconductor layer has two out of three of its crystallographic axes rotated 45 degrees with respect to the corresponding axes of the silicon unit cell, the remaining axis of the superconductor unit cell being normal to the Si (001) surface.

5 Claims, 4 Drawing Sheets

EPITAXY OF HIGH $T_c$ SUPERCONDUCTING FILMS ON (001) SILICON SURFACE

This is a continuation of application Ser. No. 07/632,589 filed Dec. 21, 1990, now abandoned, which is a continuation of application Ser. No. 07/560,242 filed Jul. 27, 1990, now abandoned, which is a continuation of application Ser. No. 07/351,288 filed May 9, 1989, now abandoned, which is a continuation of application Ser. No. 07/151,772 filed Feb. 3, 1988, now abandoned.

BACKGROUND OF THE INVENTION

1. Field of the Invention

This invention relates to epitaxy of high temperature superconductive materials on silicon, and more particularly to methods and structures wherein high temperature copper-oxide superconductors are epitaxially formed on a substrate including a (001) silicon surface.

2. Description of the Prior Art

Recently, the remarkable discovery by J. G. Bednorz and K. A. Mueller, reported in Z. Phys. B.-Condensed Matter 64, 189 (1986) and Europhysics letters, 3,379 (1987) completely changed the direction and importance of superconducting technology. Their discovery was that certain metallic oxides can exhibit superconducting transition temperatures considerably in excess of 23K. These materials are often termed "High $T_c$ Superconductors". Since the initial discoveries of Bednorz and Mueller, a vast amount of research and development has been undertaken around the world to further study these types of superconducting materials in order to extend even farther the temperature range over which the materials are superconducting, as well as to understand the basic mechanisms for superconductivity in this class of materials.

Bednorz and Mueller first showed superconducting behavior in mixed copper-oxides, typically including rare earth and/or rare earth-like elements and alkaline earth elements, for example La, Ba, Sr, . . . , and having a perovskite-like structure. Materials including the so called "1-2-3" phase in the Y-Ba-Cu-O system have been found to exhibit a superconducting transition temperature in excess of 77K.

R. B. Laibowitz and co-workers were the first to achieve and describe a method for making thin films of these materials. These thin film structures and methods for making them are described in co-pending application Ser. No. 436,851 filed Oct. 31, 1989 which is a divisional application of Ser. No. 356,565 filed May 22, 1989 also co-pending which is a continuation of Ser. No. 027584, filed Mar. 18, 1987 now abandoned and assigned to the present assignee. The work of Laibowitz et al. is also described in Phys. Rev. B, 35, 8821 (1987). In this technique, a vapor transport process is used in which the components of the superconducting film are vaporized and deposited on a substrate in an oxygen atmosphere, after which the deposited film is further annealed.

Another paper describing thin films of these high $T_c$ superconductors, and specifically high critical currents in these materials is P. Chaudhari et al, Phys. Rev. Lett., 58, 2684, June 1987. Chaudhari et al. described epitaxial high $T_c$ superconducting films formed on substrates such as $SrTiO_3$, in which the critical current at 77K was in excess $10^5 A/cm^2$.

Other references generally describing the deposition of films or layers of high $T_c$ superconducting materials include J. Cuomo, co-pending application Ser. No. 276,085 filed Nov. 23, 1988 which is a continuation of Ser. No. 043,523, filed Apr. 28, 1987, now abandoned and A. Gupta, co-pending application Ser. No. 121,982, filed Nov. 18, 1987 now abandoned, and also assigned to the present assignee. The first of these co-pending applications describes a plasma spray coating process while the second describes a method for coating a substrate, as by spraying from solution, and then patterning the coated film to eventually produce a patterned layer of high $T_c$ superconducting material.

Epitaxy of high $T_c$ superconducting films has been accomplished on several substrates, including $SrTiO_3$. In particular, superconducting films capable of carrying high critical currents have been epitaxially deposited as noted in a paper by P. Chaudhari et al, published in Physical Review Letters, 58, 2684, June 1987. However, while the epitaxial films have been prepared on substrates having a close lattice match to that of the superconducting film, no one has provided successful epitaxy on a substrate, such as silicon, whose lattice does not match well to that of the high $T_c$ superconducting film. Further, because silicon based materials have been shown to react with high $T_c$ superconducting films in a manner to destroy the superconductivity of these films, the provision of an epitaxial film which retains its superconducting properties at high temperatures without also destroying the desirable properties of silicon, would be a significant accomplishment.

Accordingly, it is a primary object of the present invention to provide a method for epitaxially depositing high $T_c$ superconducting films on a substrate including silicon, and the film-substrate combination thereby produced.

It is another object of the present invention to provide epitaxy of high $T_c$ superconducting films on silicon in a manner in which the high temperature processing required to produce the superconducting properties in these films does not adversely affect the superconducting films and the silicon-including substrate.

It is another object of the present invention to provide epitaxy of high $T_c$ superconducting films on a substrate including silicon, where the film-substrate combination is tolerant of high temperature processing steps.

It is another object of the present invention to provide high $T_c$ superconducting films/silicon-based epitaxial combinations which can be produced by many procedures as long as proper crystallographic orientations are maintained between the substrate and the superconducting film.

SUMMARY OF THE INVENTION

Epitaxial films of high $T_c$ superconductors are provided on a substrate including silicon, where the epitaxy is on a (001) surface of the silicon containing substrate. Because the present state of the technology in producing high $T_c$ superconducting films may require that high temperatures be used in order to have the proper oxygen content in the superconducting films, an intermediate layer may be required between the silicon (001) surface and the epitaxial superconducting film. This intermediate layer can be thin (for example, of the order of 1000 angstroms) and is chosen to be a material which acts as a diffusion barrier to Si atoms. The intermediate layer is epitaxial with the underlying Si (001) surface and must not be reactive with either silicon or with the superconducting film. It need not be an insulator, but an insulating material may be advantageous in particular device configurations. Also, its thickness can be chosen in accordance with the particular application and the composition of the substrate and the superconductor.

Epitaxy in the present invention is on only the (001) silicon surface. Additionally, because the high $T_c$ superconducting film does not have a matching, or closely matching lattice constant with that of silicon, the unit cell of the superconducting film must be arranged so that two out of three of the crystalline axes of the superconducting film are rotated 45 degrees with respect to the silicon lattice, while the remaining axis of the superconducting film is parallel to a normal to the (001) silicon surface. As an example, if the unit cell of the high $T_c$ superconducting film includes the axes a, b, and c, the c-axis can be normal to the (001) silicon surface, while the a and b crystalline axes are rotated 45 degrees with respect to those axes in the silicon unit cell.

Suitable intermediate layers include those comprising BaO, SrO, CuO, $Y_2O_3$, $CaF_2$ and $BaF_2$, and alloys thereof (for example, $BaSrO_2$).

These and other objects, features, and advantages will be apparent from the following more particular description of the preferred embodiments.

DESCRIPTION OF THE PREFERRED EMBODIMENTS

A technique is provided for depositing high $T_c$ superconducting copper-oxide based materials epitaxially on Si (001). Typically, these classes of superconducting materials include a rare earth or rare earth-like element and/or an alkaline earth element. Representative formulas for such materials are the following:

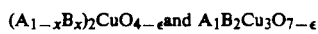

$(A_{1-x}B_x)_2CuO_{4-\epsilon}$ and $A_1B_2Cu_3O_{7-\epsilon}$ where A is a trivalent element (e.g., La, Y, and rare earth elements), B is an alkaline earth element (e.g., Ca, Sr, Ba) and x and epsilon ($\epsilon$) are variable. These superconducting materials all contain planes of CuO which have a nearly square lattice with lattice constants $a \approx b = 3.78 - 3.95$ angstroms. The unit cell of the lattice of the silicon (001) surface has lattice constants $a = b = 5.43 \text{ Å}/\sqrt{2} = 3.84 \text{ Å}$. In order to provide epitaxy to this surface, the unit cell of the superconductor film has to be rotated 45 degrees with respect to that of the silicon surface in order to provide a sufficiently close lattice constant match. If this is done, the superconductor unit cell can be matched to the lattice of the Si (001) surface which then has $a = b = 5.43$ angstroms/$\sqrt{2} = 3.84$ angstroms. Examples will be provided with respect to FIGS. 2, 3, and 4.

While it would be desirable to provide direct contact between the superconductor film and the (001) silicon surface, a problem arises using presently known techniques for obtaining high $T_c$ superconductor materials. For the preparation of these materials, temperatures of approximately 900° C. are required in order to obtain the proper crystalline structure and the necessary amounts of oxygen in the superconductor film. However, at temperatures in excess of about 600° C, silicates form at the interface of the superconductor film and the underlying silicon substrate. The formation of these silicates destroys the superconductivity of the film and degrades the silicon substrate. Thus, it has been realized that an intermediate layer should be provided between the superconducting film and the underlying silicon substrate, unless improved processing steps can be found to provide the proper crystal structure and oxygen incorporation at lower temperatures.

Another consideration is that a temperature of about 400° C. is required in order to have enough oxygen mobility in the superconductor for achieving the correct stoichiometry. Thus, there is a window between 400° C. and approximately 600° C. which would allow direct epitaxy on Si (001), if sufficient ordering and a sufficient concentration of oxygen could be established at those temperatures.

Figure 1:
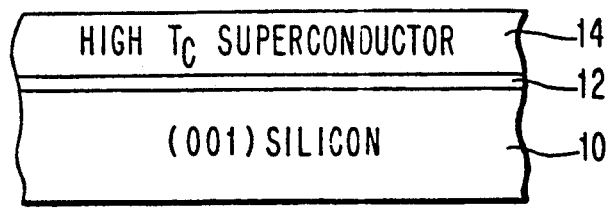
FIG. 1 is a side elevational view of a superconducting film-Si substrate epitaxial combination, including a thin intermediate layer between the superconducting film and the silicon substrate.

FIG. 1 illustrates an epitaxial structure using an intermediate layer between the Si (001) substrate and the superconducting film epitaxially deposited thereon. In this structure, the silicon substrate 10 has a thin epitaxial layer 12 thereon, which serves as a buffer between the superconducting layer 14 and the silicon substrate 10. Intermediate layer 12 must have certain properties: it must be epitaxial with the silicon (001) surface, it must be a diffusion barrier to silicon atoms and to atoms in the superconductor layer 14, and it must be non-reactive with both the silicon substrate 10 and the superconductor film 14. It is not strictly necessary that it be an insulating material, although in many multi-layer structures, this is a desirable feature. Its thickness is not critical, being chosen to prevent interdiffusion between substrate 10 and superconducting film 14. Examples of materials that can be used as intermediate layers include BaO, SrO, CuO, $Y_2O_3$, $CaF_2$, alloys thereof. It is also possible to comprise the intermediate layer 12 of a plurality of thin layers, for example, a layer of $CaF_2$ and a layer of $BaF_2$. The important feature is that the intermediate layer be epitaxial with the underlying silicon and provide chemical and physical barriers between the superconductor layer 14 and the silicon 10.

Figure 2:
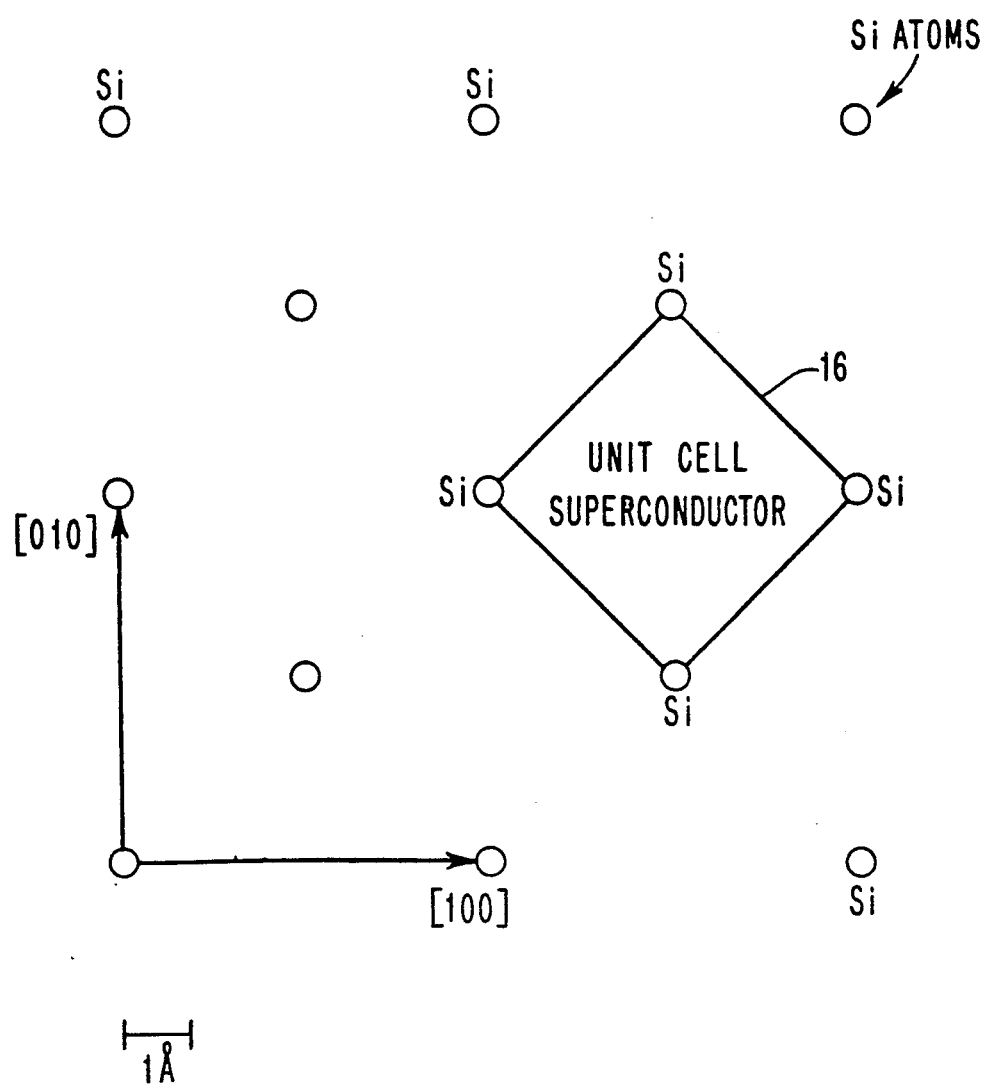
FIG. 2 is a top view of the (001) surface of silicon showing the arrangement of a unit cell of high $T_c$ superconducting material located thereover, illustrating the 45 degree rotation of the axes of the unit cell of the superconducting film with respect to the unit cell of silicon.

It has been mentioned that the unit cell of the superconducting film does not match with the unit cell of silicon. However, suitable epitaxy can be obtained if the epitaxy is onto the (001) surface of silicon, and if the unit cell of the superconducting material is properly oriented with respect to the unit cell of the silicon substrate. This requires a 45 degree rotation of the unit cell of the superconductive film with respect to that of the silicon, as illustrated in FIG. 2. This figure is a top view of a Si (001) surface illustrating the a and b crystallographic axes in the silicon surface, the positions of the silicon atoms, and the necessary orientation of the unit cell of the high $T_c$ superconductor with respect to that of the silicon surface. The silicon atoms are represented by the circles while the unit cell of the superconductor is represented by the square 16. Whether the c-axis of the superconductor unit cell is perpendicular to or parallel to the Si (001) surface, two of the three crystallographic axes of the superconductor unit cell are rotated 45 degrees with respect to the corresponding crystallographic axes of the silicon unit cell. This will be illustrated more particularly in FIGS. 3 and 4.

Figure 3:
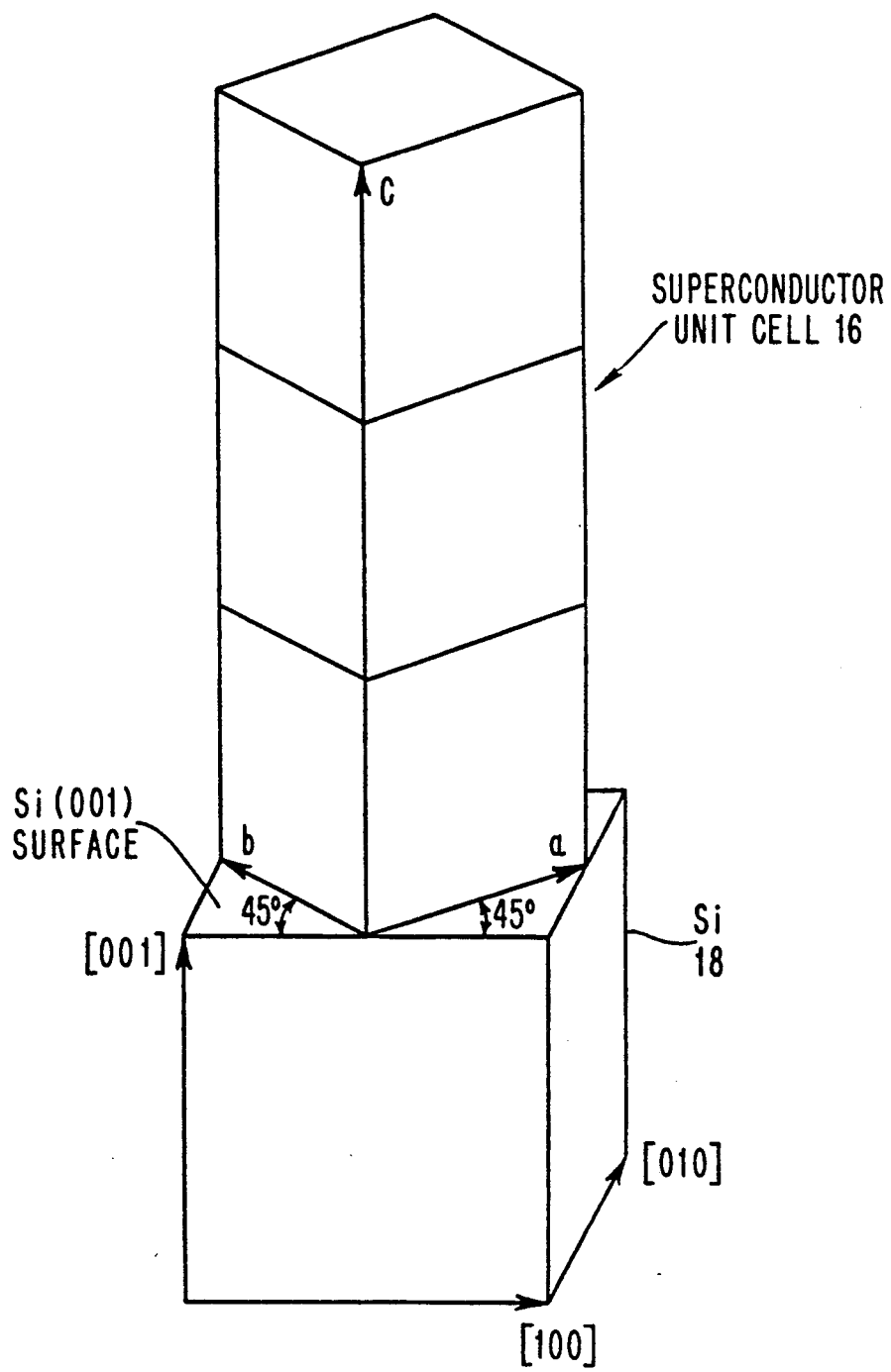
FIG. 3 is a schematic illustration in which the high $T_c$ superconductor unit cell has its c-axis normal to the (001) silicon surface, where the superconductor can be represented, by the formulas $A_1B_2Cu_3O_{7-\epsilon}$ or $(A_{1-x}B_x)_2CuO_{4-\epsilon}$, to be described herein below.

In FIG. 3, the c-axis of the superconductor unit cell 16 is normal to the (001) silicon surface, while the a and b axes of the superconductor unit cell are parallel to the Si (001) surface. The silicon substrate has a cubic unit cell 18 whose crystallographic axes are illustrated in this drawing. As is apparent, the a and b axes of the superconductor unit cell are rotated 45 degrees with respect to the corresponding axes of the silicon unit cell, while the c-axis of the superconductor is parallel to a normal to the silicon (001) surface.

Figure 4:
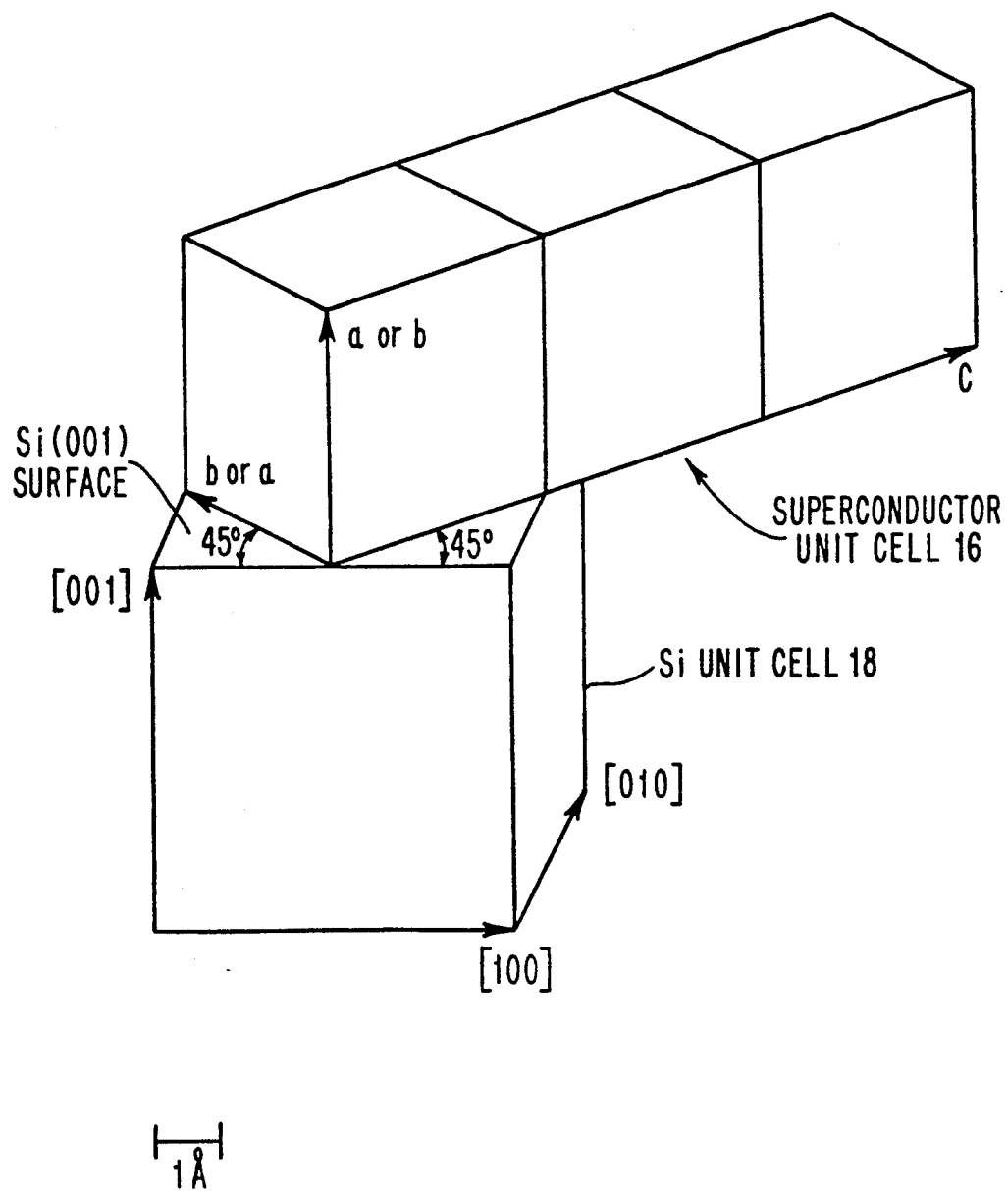
FIG. 4 is a schematic illustration in which the unit cell of the high $T_c$ superconducting film has its c-axis parallel to the (001) silicon surface, where the superconducting film has a formula $A_1B_2Cu_3O_{7-\epsilon}$.

FIG. 4 represents superconducting copper oxide material with respect to a silicon substrate. Here, the c-axis of the superconducting unit cell 16 is parallel to the Si (001) silicon surface, while the a or b axis of the superconductor unit cell is perpendicular to the Si (001) surface. Again, two out of the three crystallographic axes of the superconductor unit cell are rotated 45 degrees with respect to the corresponding axes of the silicon unit cell 18, in order to obtain epitaxy.

In both FIGS. 3 and 4, the intermediate layer 12 is not illustrated in order to simplify the drawing. However, it will be understood by those of skill in the art that the intermediate layer epitaxially matches the underlying silicon and would therefore not alter the crystallographic orientations illustrated in these figures.

Examples of superconducting materials that can be lattice matched to a silicon (001) surface include: $La_{1.85}Ba_{0.15}CuO_4$ with $a=b=3.78$ Å ($-2\%$ misfit) and $Y_1Ba_2Cu_3O_{7-\epsilon}$ with $a=3.82$ Å, $b=3.88$ Å, $c/3=3.89$ Å (about 1% misfit). Both classes of materials can exhibit epitaxy with the c-axis of the superconductor normal to the Si (001) surface. In this example, the CuO planes of the superconductor are parallel to the substrate surface. For the $A_1B_2Cu_3O_{7-\epsilon}$ class of materials, it is possible to have epitaxy with the c-axis of the superconductor either perpendicular to or parallel with the Si (001) surface. If the c-axis is parallel to Si (001) surface, the CuO planes in the superconductor are perpendicular to the silicon surface.

Epitaxy in this manner can provide high quality superconducting materials having well-defined orientation. Applications of these epitaxial structures include low resistance electrical connections in electronic devices, magnetic shielding, and three-dimensional device structures.

It will be appreciated by those of skill in the art that the present invention applies to epitaxial structures including silicon (001) surfaces and any copper oxide superconductor thereon. Thus, the teaching of this invention can include copper-oxide based compositions having any combinations of rare earth or rare earth-like elements and/or alkaline earth elements as well as copper oxide superconductors which do not contain rare earth elements. Further, it will be apparent to those of skill in the art that the Si (001) surface is crystallographically equivalent to the Si (100) surface, the designation of these surfaces being merely a matter of the choice of coordinates used to define the directions and surfaces.

It will also be understood in the art that this invention includes superconductors and the silicon substrates, where substantial epitaxy occurs for lattice constant mismatches up to approximately 20 percent. However, as the mismatch becomes smaller, the quality of the epitaxial deposition increases and the defect density in the deposited superconducting film also decreases. By proper choice of the intermediate layer and the composition of the superconducting layer, very close matching can be achieved in order to provide low defect density materials.

It should further be understood that the thickness of the superconductor layer is arbitrary, being chosen in accordance with the particular application for which epitaxial films are required.

Figure 5:
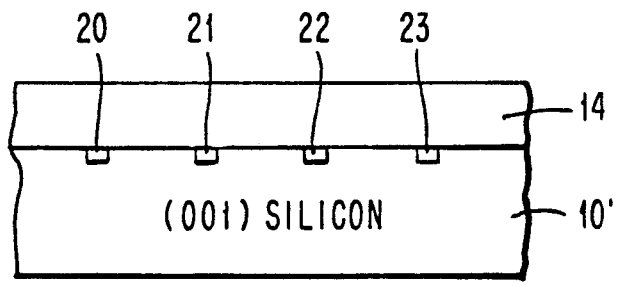
FIG. 5 is a cross section view taken along lines 5—5 in FIG. 6.
Figure 6:
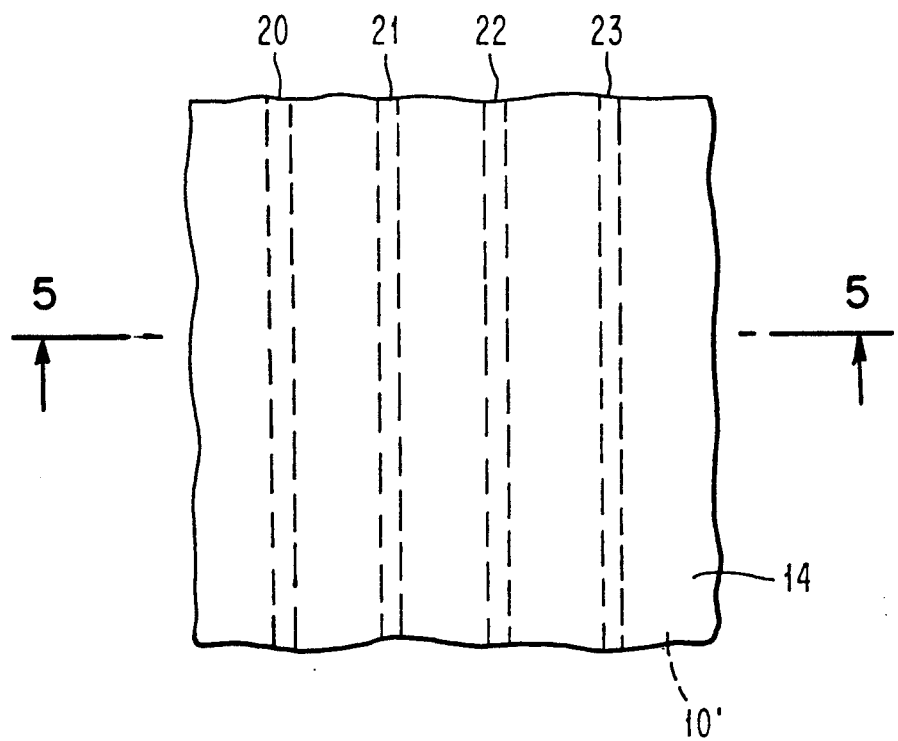
FIG. 6 is a top view of an alternate embodiment of the invention.

It will also be understood by those of skill in the art that the processes used to form the intermediate layer and the superconductor layer are well known. For example, the intermediate layer is easily formed by chemical vapor deposition or, preferably, by molecular beam epitaxy in which a very thin, high quality layer can be deposited on the Si (001) substrate. The superconductor layer can be deposited by well known techniques including vapor deposition, such as sputtering or evaporation in an oxygen atmosphere. In general, the silicon substrate surface would be heated in order to remove any oxides formed thereon, which is a standard preparation technique. Atomically, clean silicon surfaces would be located in an ultra high vacuum chamber, after which the intermediate layer would be deposited. It is preferable to also deposit the superconducting layer in the same ultra high vacuum, in order to reduce the effect of contaminants, etc. While the invention has been described with respect to several embodiments thereof, it will be appreciated by those of skill in the art that variations may be made therein without departing from the spirit and scope of the present invention. In this regard, the invention is directed to epitaxy of a high $T_c$ copper-oxide-based superconducting layer on a silicon containing (001) surface wherein two out of the three crystallographic axes of the unit cell of the superconducting material are rotated 45 degrees with respect to the silicon lattice, the remaining axis of the superconductor unit cell being parallel to a normal to the (001) silicon surface. The substrate includes materials such as intrinsic or doped silicon, as well as silicon having epitaxial metal silicide layers with (001) surface orientations. An example shown in FIG. 5 is (001) silicon 10' having buried therein and coplanar therewith epitaxial metal silicide conducting lines 20–23. A high $T_c$ superconducting oxide 14 can be epitaxially formed on such a substrate using the principles of this invention, so that the superconductor 14 overlies both the (001) silicon 10' and the (001) metal silicide 14. FIG. 6 is a top view of FIG. 5.

I claim:

1. A method of forming a high Tc copper-oxide superconductor-substrate combination comprising the steps of:

selecting a substrate including a layer of silicon having a (001) surface thereof, first forming an intermediate layer over said silicon layer, said intermediate layer being substantially epitaxial with said (001) silicon surface and being essentially non-reactive with said silicon layer and said superconductor at the temperatures used to form a high Tc copper-oxide superconductor layer, and which is selected from the group consisting of BaO, SrO, CuO, $Y_2O_3$, $CaF_2$, $BaF_2$, alloys thereof and metal silicide; and second forming said layer of high Tc copper-oxide superconductor having lattice matching to said (001) silicon surface on said intermediate layer, said superconductor having a unit cell characterized by crystallographic axes a,b,c, two out of said a,b,c, axes being oriented substantially 45 degrees with respect to the corresponding two axes of the unit cell of said silicon layer and the remaining axis of said superconductor unit cell being substantially perpendicular to said (001) surface of said silicon layer.

2. The method of claim 1 wherein said high Tc copper-oxide superconductor includes a rare earth element and an alkaline earth element.

3. The method of claim 1 wherein said high Tc copper-oxide superconductor is comprised of Y—Ba—Cu oxide.

4. The method of claim 1 wherein said high Tc copper-oxide superconductor is selected from the group consisting of $YBa_2Cu_3O_{7-\epsilon}$, and $(La_{1-x}Ba_x)_2CuO_4$.

5. The method of claim 1 wherein said intermediate layer has a thickness between about 100 angstroms and about 10,000 angstroms.

6. The method of claim 1 wherein prior to said step of first forming, performing the step of postioning atomically clean silicon surfaces of said layer of silicon in an ultra high vaccuum chamber.

* * * * *